United States Patent
Aust et al.

(10) Patent No.: US 11,377,310 B2
(45) Date of Patent: Jul. 5, 2022

(54) MAGNETIC LEVITATION SYSTEM, BASE OF A MAGNETIC LEVITATION SYSTEM, VACUUM SYSTEM, AND METHOD OF CONTACTLESSLY HOLDING AND MOVING A CARRIER IN A VACUUM CHAMBER

(71) Applicants: Applied Materials, Inc., Santa Clara, CA (US); Henning Aust, Mühltal (DE); Thorsten Meiss, Darmstadt (DE)

(72) Inventors: Henning Aust, Mühltal (DE); Thorsten Meiss, Darmstadt (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/272,582

(22) PCT Filed: Sep. 19, 2018

(86) PCT No.: PCT/EP2018/075375
§ 371 (c)(1),
(2) Date: Mar. 1, 2021

(87) PCT Pub. No.: WO2020/057739
PCT Pub. Date: Mar. 26, 2020

(65) Prior Publication Data
US 2021/0354934 A1    Nov. 18, 2021

(51) Int. Cl.
*B65G 54/02*    (2006.01)
*B65G 39/08*    (2006.01)
(Continued)

(52) U.S. Cl.
CPC .............. *B65G 54/02* (2013.01); *B65G 39/08* (2013.01); *H01L 21/677* (2013.01); *B65G 49/064* (2013.01); *B65G 2201/022* (2013.01)

(58) Field of Classification Search
CPC ...... B65G 54/02; B65G 39/08; B65G 49/064; B65G 2201/022; H01L 21/677; H01L 21/67709; H01L 21/6773; H01L 21/67167
(Continued)

(56) References Cited

U.S. PATENT DOCUMENTS

| 8,960,099 | B2 * | 2/2015 | Hosek | ............... H01L 21/67161 104/282 |
| 9,027,739 | B2 * | 5/2015 | Hosek | ............... H01L 21/67706 198/619 |

(Continued)

FOREIGN PATENT DOCUMENTS

| DE | 102014003882 A1 | 9/2015 |
| JP | H05236610 A | 9/1993 |

(Continued)

OTHER PUBLICATIONS

International Search Report and Written Opinion, PCT/EP2018/075375, dated May 29, 2019.

*Primary Examiner* — James R Bidwell
(74) *Attorney, Agent, or Firm* — Patterson & Sheridan, LLP

(57) ABSTRACT

A magnetic levitation system for contactlessly holding and moving a carrier in a vacuum chamber, including a base defining a transportation track, a carrier movable above the base along the transportation track, and at least one magnetic bearing for generating a magnetic levitation force between the base and the carrier. The at least one magnetic bearing includes a first magnet unit arranged at the base and a second magnet unit arranged at the carrier. The magnetic levitation system further includes a magnetic side stabilization device for stabilizing the carrier in a lateral direction, the magnetic side stabilization device comprising a stabilization magnet unit arranged at the base, wherein at least one of the first magnet unit and the first stabilization magnet unit is (Continued)

arranged in a housing space of the base, the housing space being separated from an inner volume of the vacuum chamber by a separation wall.

20 Claims, 7 Drawing Sheets

(51) Int. Cl.
    *H01L 21/677*     (2006.01)
    *B65G 49/06*     (2006.01)

(58) Field of Classification Search
    USPC .................................................. 198/619, 805
    See application file for complete search history.

(56) References Cited

U.S. PATENT DOCUMENTS

| | | | |
|---|---|---|---|
| 9,512,515 B2* | 12/2016 | Chang | B05B 13/0221 |
| 10,119,982 B2* | 11/2018 | Baer | B65G 43/00 |
| 2008/0029368 A1 | 2/2008 | Komori | |
| 2013/0135603 A1* | 5/2013 | Binnard | G03B 27/581 |
| | | | 355/72 |

FOREIGN PATENT DOCUMENTS

| | | | | |
|---|---|---|---|---|
| JP | 2007214539 A | | 8/2007 | |
| WO | 2021/107207 A1 * | | 6/2021 | B65G 54/02 |

\* cited by examiner

MAGNETIC LEVITATION SYSTEM, BASE OF A MAGNETIC LEVITATION SYSTEM, VACUUM SYSTEM, AND METHOD OF CONTACTLESSLY HOLDING AND MOVING A CARRIER IN A VACUUM CHAMBER

TECHNICAL FIELD

Embodiments of the present disclosure relate to the technical field of magnetic levitation systems, particularly for substrate processing and transport in a vacuum system, e.g. in a material deposition system. Embodiments of the present disclosure particularly relate to magnetic levitation systems and methods for contactlessly holding and moving a carrier in a vacuum chamber. More specifically, embodiments of the present disclosure relate to a magnetic levitation system for transporting carriers, to a base of a magnetic levitation system, and to a vacuum system including a magnetic levitation system. Further, embodiments of the present disclosure relate to methods for contactlessly holding and moving a carrier in a vacuum chamber in an essentially horizontal orientation.

BACKGROUND

Techniques for layer deposition on a substrate include, for example, sputter deposition, physical vapor deposition (PVD), chemical vapor deposition (CVD), thermal evaporation and spin coating. Coated substrates may be used in several applications and in several technical fields. For instance, coated substrates may be used for the manufacture of electronic devices on wafers or for the manufacture of display devices. Display devices can be used in the manufacture of television screens, computer monitors, mobile phones, other hand-held devices, and the like for displaying information. Typically, displays are produced by coating a substrate with a stack of layers of different materials.

In order to deposit a layer stack on a substrate, an arrangement of processing modules can be used. A processing system includes a plurality of subsequent processing modules, such as deposition modules and optionally further processing modules, e.g., cleaning modules and/or etching modules, wherein the substrates are processed in two or more processing modules, such that a plurality of substrates can be continuously or quasi-continuously processed in the processing system. The processing of the substrate may be conducted under subatmospheric pressure in a vacuum system.

The substrate may be carried through the vacuum system by a carrier, i.e. a carrying device for carrying the substrate. The carrier carrying the substrate is typically transported through a vacuum system using a transport system. The transport system may be configured for conveying the carrier having the substrate positioned thereon along a transport path.

Technical challenges with respect to the carrier transport and the deposition of materials on substrates in a vacuum system need to be mastered. In particular, an accurate, reliable and smooth transportation of the carriers through the vacuum system is challenging. For instance, ensuring the functioning of a transportation system in a vacuum system can be challenging. In particular, providing autonomous, agile, reliable carrier transport systems for vacuum environments at low costs is challenging. In particular, transport of carriers without producing particles is challenging.

Accordingly, there is a continuing demand for improved systems, apparatuses and methods for transportation of carriers as well as for improved vacuum systems which overcome at least some problems of the state of the art.

SUMMARY

In light of the of the above, magnetic levitation systems, bases for magnetic levitation systems, vacuum systems, and methods for contactlessly holding and moving a carrier in a vacuum chamber are provided. Further, vacuum systems for substrate processing, including a magnetic levitation system are provided. Further aspects, benefits, and features of the present disclosure are apparent from the claims, the description and the accompanying drawings.

According to a first aspect of the present disclosure, a magnetic levitation system for contactlessly holding and moving a carrier in a vacuum chamber is provided. The magnetic levitation system includes a base defining a transportation track, a carrier movable above the base along the transportation track, and at least one magnetic bearing for generating a magnetic levitation force between the base and the carrier. The at least one magnetic bearing includes a first magnet unit arranged at the base and a second magnet unit arranged at the carrier. The magnetic levitation system further includes a magnetic side stabilization device for stabilizing the carrier in a lateral direction, the magnetic side stabilization device including a stabilization magnet unit arranged at the base. The first magnet unit and/or the stabilization magnet unit are arranged in a housing space of the base, the housing space being separated from an inner volume of the vacuum chamber by a separation wall.

According to a second aspect of the present disclosure, a base of a magnetic levitation system as described herein, for contactlessly holding and moving a carrier in a vacuum chamber is provided. The base defines a transportation track along which the carrier can be contactlessly moved above the base. The base includes a housing space separated from an inner volume of the vacuum chamber by a separation wall, the housing space being configured to house a first magnet unit of at least one magnetic bearing and/or a stabilization magnet unit of a magnetic side stabilization device.

According to a third aspect of the present disclosure, a vacuum system is provided. The vacuum system includes a transport vacuum chamber, a first vacuum processing chamber and a second vacuum processing chamber. Further, the vacuum system includes a magnetic levitation system for contactlessly holding and moving a carrier in the transport vacuum chamber from the first vacuum processing chamber to the second vacuum processing chamber along a transportation track. The magnetic levitation system includes a base defining the transportation track, a carrier movable above the base along the transportation track, and at least one magnetic bearing for generating a magnetic levitation force between the base and the carrier. The at least one magnetic bearing includes a first magnet unit arranged at the base and a second magnet unit arranged at the carrier. The magnetic levitation system further includes a magnetic side stabilization device for stabilizing the carrier in a lateral direction, the magnetic side stabilization device including a stabilization magnet unit arranged at the base. At least one of the first magnet unit and the stabilization magnet unit is arranged in a housing space of the base, the housing space being separated from an inner volume of the vacuum chamber by a separation wall.

According to a fourth aspect of the present disclosure, a method of contactlessly holding and moving a carrier in a vacuum chamber is provided. The method includes providing a base defining a transportation track and a carrier movable above the base along the transportation track, and generating a magnetic levitation force between the base and the carrier with at least one magnetic bearing including a first magnet unit arranged at the base and a second magnet unit arranged at the carrier. The method further includes stabilizing the carrier in a lateral direction with a magnetic side stabilization device including a stabilization magnet unit arranged at the base and a second magnet unit arranged at the carrier. The carrier is arranged in an inner volume of the vacuum chamber provided at a first pressure, and at least one of the first magnet unit and the stabilization magnet unit is arranged in a housing space of the base provided at a second pressure different from the first pressure.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1:
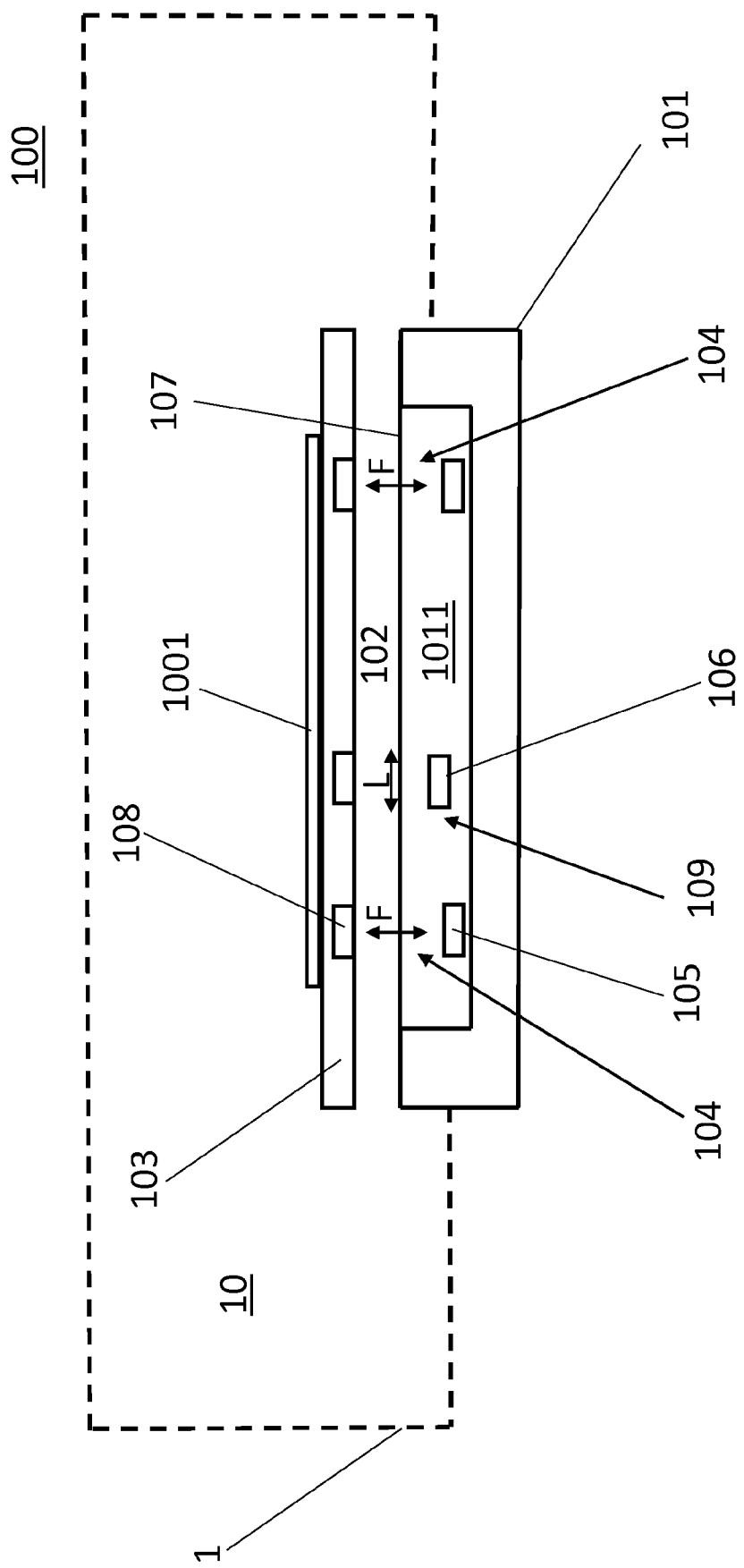
FIG. 1 shows a schematic cross sectional view of a magnetic levitation system according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Before various embodiments of the present disclosure are described in more detail, some aspects with respect to some terms and expressions used herein are explained.

In the present disclosure, a magnetic levitation system can be understood as a system suitable for, i.e. configured to contactlessly hold and move a carrier. Additionally or alternatively, a magnetic levitation system of the present disclosure can be understood as a system that includes at least a base, a carrier which is movable relative to the base, and at least one magnetic bearing for generating a magnetic levitation force between the base and the carrier. In some embodiments, the carrier can be contactlessly moved relative to the base while being floatingly held by magnetic forces above the base.

In the present disclosure, a carrier can be understood as a carrying device configured to carry a substrate, particularly a wafer or another flat substrate such as a glass plate, in a vacuum system. In particular, the carrier may be configured for carrying the substrate in an essentially horizontal orientation through a vacuum chamber. The carrier may have essentially the shape of a flat plate that can be moved above the base in an essentially horizontal orientation. The carrier may include a chucking device for holding the substrate at the carrier. For example, the carrier may have a mechanical chucking device or an electric or magnetic chucking device for holding the substrate at the carrier. For example, the carrier may include a flat top surface for placing the substrate on top of the carrier. In some embodiments, a carrier of the present disclosure can have a weight of 1 kg or more and 20 kg or less, particularly 3 kg or more and 10 kg or less, for example about 4 or 5 kg.

The term "substrate" in the present disclosure can be understood as encompassing a substrate such as a wafer or a glass sheet that is to be processed in a vacuum system. The substrate may be transported through the vacuum system in an essentially horizontal orientation. In some embodiments, the substrate may be configured for display manufacturing, e.g. TFT display manufacturing. A substrate according to embodiments described herein can have a weight of 100 g or more and 1000 g or less, particularly 300 g or more and 700 g or less.

In other embodiments, the carrier may be held in an essentially vertical orientation above the base. An essentially vertically oriented carrier can carry a substrate and/or a mask in an essentially vertical orientation, i.e., an angle between the main surface of the carried substrate (or mask) and the gravity vector may be 10° or less. A magnetic levitation system configured for the contactless transport of a vertically oriented carrier is particularly space-saving.

A substrate according to the present disclosure may refer to a wafer, particularly a wafer that is to be transported and processed in a vacuum system in a horizontal orientation. In other words, the main surface of the substrate may be essentially horizontally oriented during the transport by the magnetic levitation system and/or during processing.

According to a first aspect of the present disclosure, a magnetic levitation system for contactlessly holding and moving a carrier is provided.

FIG. 1 shows a schematic cross sectional view of a magnetic levitation system 100 for contactlessly holding and moving a carrier in a vacuum chamber according to embodiments described herein. As exemplarily shown in FIG. 1, the magnetic levitation system 100 includes a base 101 defining a transportation track 102. The transportation track 102 extends perpendicular to the paper plane of FIG. 1, i.e. in the longitudinal direction of the base 101. A carrier 103 is contactlessly movable above the base 101 along the transportation track 102. The transportation track 102 defined by the base 101 may extend through a vacuum chamber, e.g. between a plurality of processing modules of a vacuum system. Accordingly, the carrier carrying a substrate 1001 can be moved between a plurality of processing modules along the transportation track 102, and the substrate 1001 may be processed in a plurality of processing modules.

The base may define a predetermined transportation track which extends in the transport direction and which allows a carrier transport in the transport direction along the transportation track, e.g. between two processing chambers. The length of the base in the transport direction may be several meters or tens of meters. In other embodiments, the length of the base in the transport direction may be only several centimeters up to tens of meters. The width of the base in the lateral direction, i.e. perpendicular to the transport direction, may essentially correspond to the width of the carrier or may be slightly larger than the width of the carrier (e.g., carrier width times 1.5 or less). For example, the width of the base in the lateral direction may be 2 m or less, particularly 1 m or less. Accordingly, a predetermined transportation track defining a transport path for the carrier may be provided by the base. In some embodiments, the predetermined transportation track is provided in a vacuum tunnel which extends between two vacuum chambers and allows a carrier transport between said vacuum chamber through the vacuum tunnel.

In some embodiments, the base may define a first transportation track and a second transportation extending next to each other, wherein the first transportation track and the second transportation track may, at least in sections, extend next to each other at a distance of 1 m or more. In some embodiments, two or more predetermined transportation tracks may be arranged above one housing space covered by one separation wall in order to reduce implementation efforts.

The magnetic levitation system 100 includes at least one magnetic bearing 104 for generating a magnetic levitation force F between the base 101 and the carrier 103, wherein the at least one magnetic bearing 104 includes a first magnet unit 105 arranged at the base 101 and a second magnet unit 108 arranged at the carrier 103. The magnetic bearing 104 is configured to generate the magnetic levitation force F between the base 101 and the carrier 103 such that the carrier can be held contactlessly with respect to the base by a magnetic force. In some embodiments, the magnetic levitation force is a repulsive magnetic force acting between the base and the carrier. During operation, the carrier may be urged into a floating state above the base by the repulsive magnetic force acting between the first magnet unit 105 and the second magnet unit 108. In some embodiments, the magnetic levitation force is generated in a purely passive way.

In other embodiments, the magnetic levitation force can be generated partially in a passive way, e.g. by interacting permanent magnets, and partially in an active way, e.g. with an actively controlled magnetic bearing.

The magnetic levitation system 100 may further include a magnetic side stabilization device 109 for stabilizing the carrier 103 in a lateral direction L, wherein the magnetic side stabilization device 109 includes a stabilization magnet unit 106 arranged at the base 101. The lateral direction L may be a horizontal direction perpendicular to the longitudinal direction of the transportation track 102. The longitudinal direction of the transportation track corresponds to the transport path of the carrier along the base. Accordingly, the magnetic side stabilization device is configured to stabilize the carrier in a direction perpendicular to the transport path. In an embodiment, the magnetic side stabilization device 109 may be a passive device, e.g. including a plurality of permanent magnets arranged such that the carrier is reliably held at a predetermined lateral position above the base. In another embodiment, the magnetic side stabilization device 109 may be actively controlled. In other words, an actual position of the carrier 103 in the lateral direction L may be measured, may be compared to a target position of the carrier in the lateral direction L, and the stabilization magnet unit 106 may be controlled such that the carrier is held at the target position above the base.

According to embodiments described herein, at least one of the first magnet unit 105 of the magnetic bearing and the stabilization magnet unit 106 is arranged in a housing space 1011 of the base 101, wherein a separation wall 107 is arranged between the housing space 1011 and an inner volume 10 of the vacuum chamber 1 where the carrier is arranged. In the embodiment depicted in FIG. 1, both the first magnet unit 105 and the stabilization magnet unit 106 are arranged in the housing space 1011 of the base.

Placing at least one of the first magnet unit 105 and the stabilization magnet unit 106 in a housing space separate from the inner volume of the vacuum chamber 1 may be beneficial for the following reasons. The inner volume of the vacuum chamber and the housing space may be separately accessible, which may facilitate the service and maintenance of the magnetic levitation system. For example, the first magnet unit 105 and/or the stabilization magnet unit 106 may be accessible without flooding the vacuum chamber. Further, heat radiation from the first magnet unit 105 and/or from the stabilization magnet unit 106, which may include a coil, into the inner volume of the vacuum chamber may be reduced. Yet further, the risk of contamination of the inner volume of the vacuum chamber can be reduced. In some embodiments, the carrier can be contactlessly transported above the separation wall 107 which closes the housing space 1011. Accordingly, the carrier can be moved without mechanical contact above the base 101, such that the base provides a closed housing space for magnetic components of the magnetic levitation system. Particle generation in the inner volume of the vacuum chamber can be reduced or entirely avoided. Yet further, magnet units and control circuits which are not vacuum-compatible can be used in the housing space. Further, the actively controlled components of the magnetic levitation system may be arranged in the housing space separate from the inner volume of the vacuum chamber. The housing space is typically more easily accessible by circuitry and supply lines, whereas the carrier that is arranged in the inner volume of the vacuum chamber may bear only passive magnet components.

According to some embodiments, the first magnet unit 105 and the stabilization magnet unit 106 can be arranged in the housing space 1011 of the base.

According to embodiments combinable with embodiments as described herein, the magnetic bearing 104 can include a first magnet unit 105 arranged at the base 101 and a second magnet unit 108 arranged at the carrier 103.

The first magnet unit 105 and the second magnet unit 108 can be made of material having permanent magnetic properties. In particular, the first magnet unit 105 and the second magnet unit 108 can be permanent magnets. Each permanent magnet has two poles of opposite polarity, namely a north pole facing a south pole. The first magnet unit 105 and the second magnet unit 108 may be arranged such that a pole of one polarity of the first magnet unit 105 faces toward a pole of the same polarity of the second magnet unit 108, when the carrier is being held by the magnetic bearing above the base. Accordingly, a repulsive magnetic force between the first magnet unit 105 and the second magnet unit 108 may contactlessly hold the carrier above the base, particularly above the housing space 1011 of the base that is closed by the separation wall 107. In particular, the magnetic levitation force may be generated by the magnetic levitation system in a purely passive way, particularly by permanent magnets.

Figure 2:
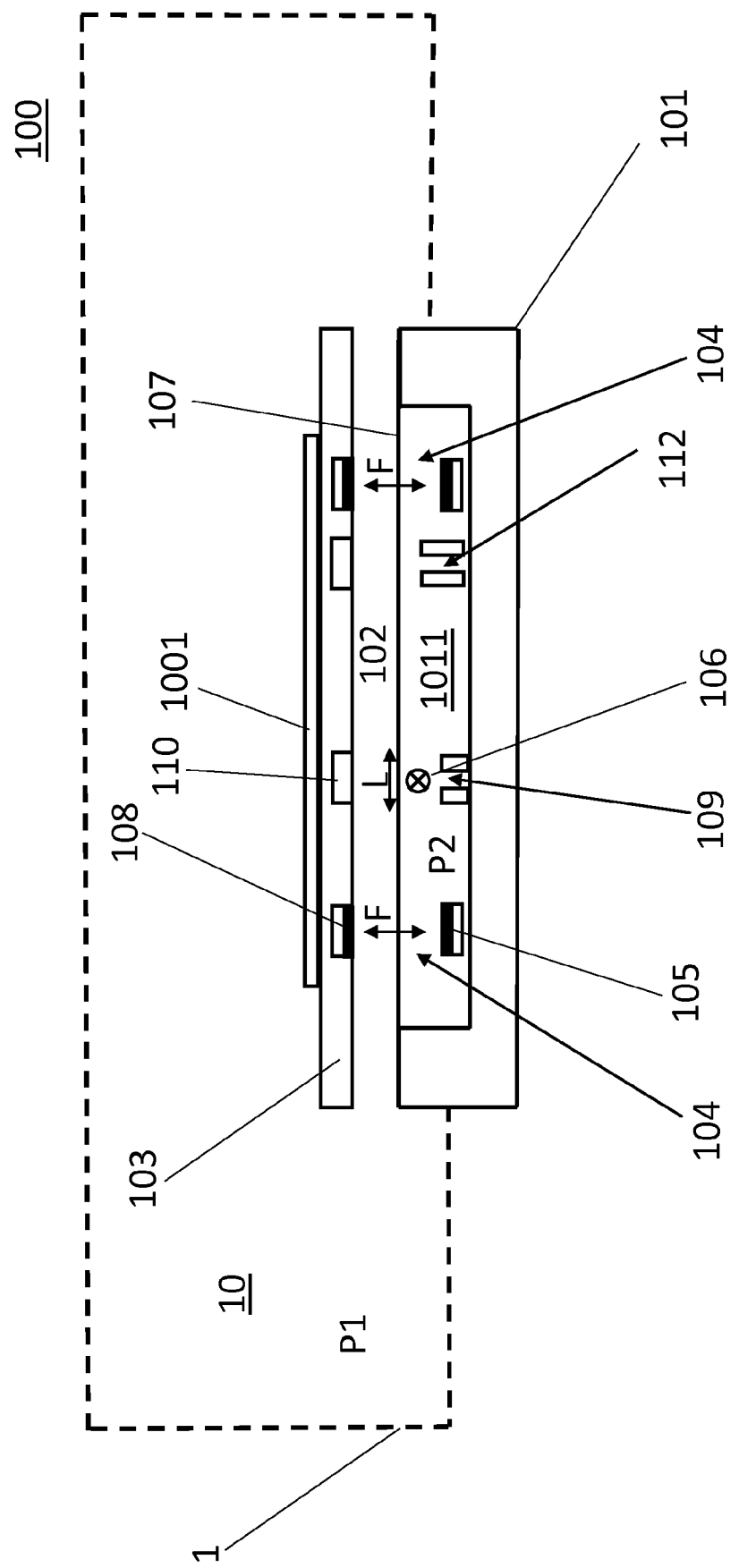
FIG. 2 shows the magnetic levitation system of FIG. 1, wherein the first magnet unit and the second magnet unit are permanent magnets with poles of the same polarity facing each other.

FIG. 2 shows a schematic cross sectional view of a magnetic levitation system according to embodiments described herein. As exemplarily shown in FIG. 2, the magnetic levitation system 100 includes a magnetic bearing 104 with a first magnet unit 105 and a second magnet unit 108. The first magnet unit 105 and the second magnet unit 108 can be permanent magnets with poles of the same polarity facing each other. As exemplarily illustrated in FIG. 2, the north pole of the first magnet unit 105 and the north pole of the second magnet unit 108 can be arranged so as to face each other when the carrier is being held by the magnetic bearing 104. Alternatively, the south poles of the first magnet[ic] unit 105 and the second magnet unit 108 can face each other. Several magnetic bearings may be arranged spaced apart from each other in the lateral direction L for holding a horizontally oriented carrier above the base.

Accordingly, the magnetic levitation force F can be beneficially generated by the magnetic interaction between the first magnet unit 105 and the second magnet unit 108. In particular, the magnetic levitation force F can be a repulsive magnetic force imparted by two poles of the first magnet unit 105 and the second magnet unit 108 having the same polarity and facing each other.

By providing a magnetic levitation force F being generated by permanent magnets, particularly exclusively permanent magnets, the magnetic levitation system can be simplified. For instance, permanent magnets may need less service and maintenance than actively controlled electromagnets and are more durable. Further, permanent magnets do not generate heat during operation. In particular, the carrier may be provided as a purely passive mover which is contactlessly held exclusively by a levitation force generated by permanent magnets. The carrier may neither need a battery nor a power supply for being transported along the transportation track. As is depicted in FIG. 2, it may be sufficient to provide the carrier with a second magnet unit 108, particularly at the bottom surface of the carrier, which may be a permanent magnet. In particular, the carrier may be provided with at least two second magnet units of respective magnetic bearings which are provided spaced apart from each other in the lateral direction L. Similarly, at least two first magnet units of respective magnetic bearings may be provided in the housing space 1011 of the base, wherein the at least two first magnet units may be spaced apart from each other in the lateral direction L at the same distance. Accordingly, the carrier can be held above the base in a horizontal orientation via two or more magnetic bearings, which may be purely passive components.

According to embodiments combinable with other embodiments described herein, the magnetic levitation force F may be generated by magnetic bearings including pairs of permanent magnets, each pair of permanent magnets having poles of the same polarity facing each other when the carrier is being held by the respective magnetic bearing.

In the present disclosure, the separation wall 107 separates the inner volume 10 of the vacuum chamber 1 and the housing space 1011 of the base 101. In particular, the separation wall 107 can be arranged so as to establish a pressure gradient between the inner volume 10 of the vacuum chamber 1 and the housing space 1011 of the base 101. Accordingly, a first pressure P1 may be provided in the inner volume 10 of the vacuum chamber 1, particularly the first pressure P1 may refer to a vacuum pressure state. A second pressure P2 may be provided in the housing space 1011 of the base 101, particularly the second pressure P2 may be greater than the first pressure P1, more particularly the second pressure P2 may be an atmospheric pressure.

As exemplarily shown in FIG. 2, the separation wall 107 can provide a vacuum-tight sealing between the inner volume 10 of the vacuum chamber 1 and the housing space 1011 of the base 101.

By providing a separation wall 107 as described herein, a more reliable magnetic levitation system can be provided which can be easier serviced. For instance, the stabilization magnet unit 106, typically an actively controlled unit, can be advantageously arranged in the housing space under atmospheric conditions. Additionally, a magnetic levitation system according to the present disclosure may be beneficial in terms of design as well as production costs, by reducing the number of components.

In the present disclosure, the separation wall 107 can be provided as a flat cover covering the base 101 and extending along the transportation track 102. Accordingly, a transportation track with an essentially flat top surface can be provided along which the carrier can be transported. Conventional transportation tracks of magnetic levitation systems typically include rails having a complex shape bearing the magnet units and engaging with the carrier. On the other hand, according to embodiments described herein, the transportation track 102 may have an essentially flat top surface formed by the separation wall 107 and may be configured for holding and transporting a carrier having an essentially flat bottom surface.

Figure 7:
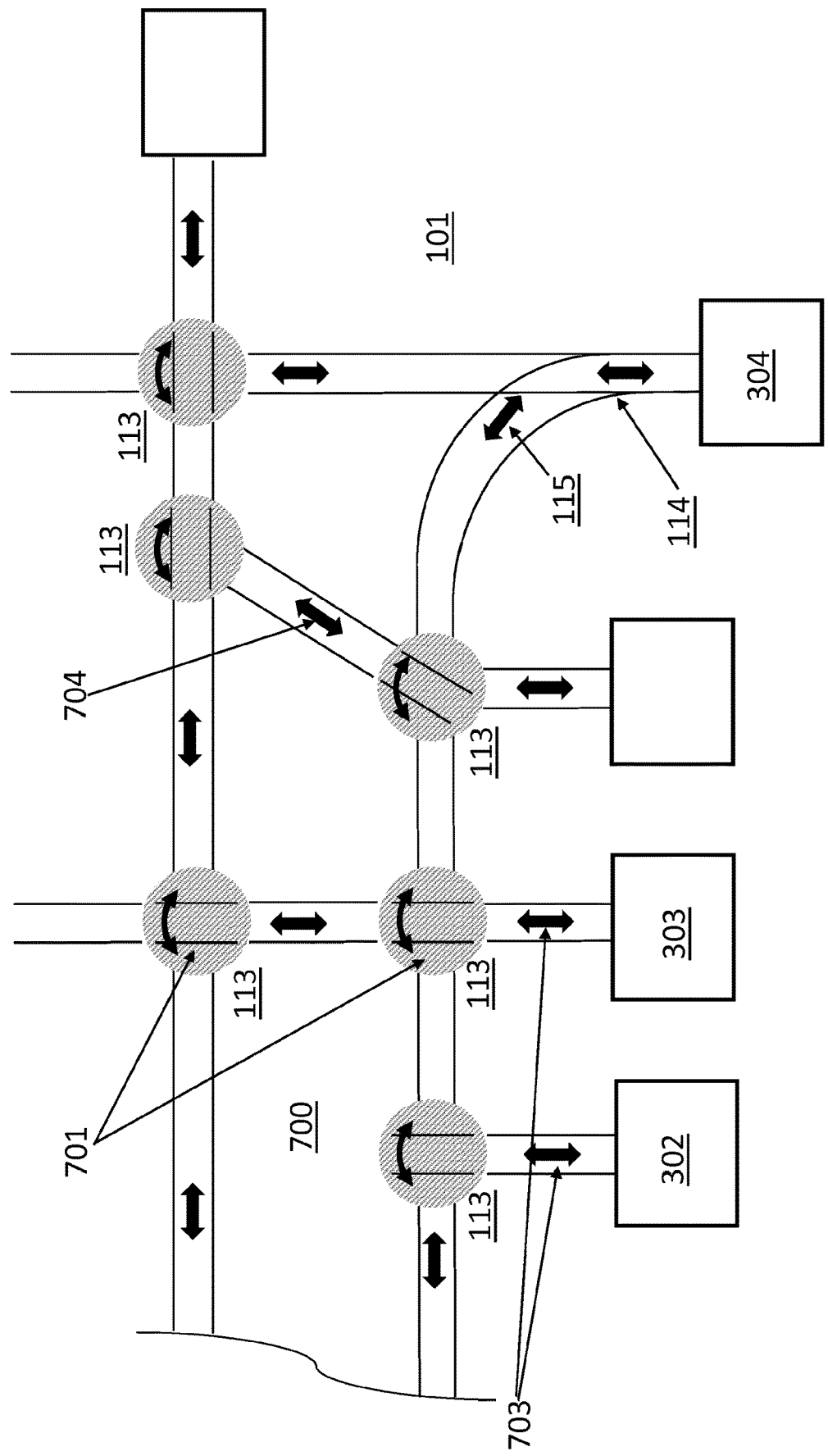
FIG. 7 shows a schematic top view of a base defining a transportation track having the shape of a grid according to embodiments described herein.

By providing a flat cover, the magnetic levitation system according to the present disclosure can beneficially exhibit improved transporting capabilities. Further, the transport flexibility can be improved. For example, the carrier can move uphill, downhill, along a curved path, and/or along a straight path simply by providing a base defining a transportation path with a cover extending in the respective direction, particularly uphill, downhill, curved and/or straight as well as upside down. Reference is made to FIG. 7 in this respect, which shows a base defining a transportation track which has the shape of a grid connecting a plurality of vacuum processing chambers.

According to embodiments combinable with other embodiments described herein, the separation wall 107 can have a thickness suitable for maintaining a pressure gradient between the inner volume 10 of the vacuum chamber and the housing space 1011 of the base 101. In particular, the thickness of the separation wall 107 may be 0.5 mm or more and 5 mm or less, particularly 1 mm or more and 3 mm or less.

According to embodiments combinable with embodiments as described herein, the flat cover may be provided as a flat cover sheet. The separation wall may be made of a non-magnetic material. In particular, the separation wall 107 can be provided as a non-magnetic metal sheet, particularly a non-magnetic steel sheet. By providing a cover having non-magnetic properties, the magnetic field between the magnet units arranged inside the housing space and the magnet units arranged at the carrier is not negatively affected. In other words, the separation wall 107 can be arranged between the first magnet unit and the second magnet unit without adversely influencing the magnet field. Accordingly, the magnetic levitation force F can be beneficially maintained.

As is exemplarily shown in FIG. 2, the stabilization magnet unit 106 of the magnetic side stabilization device 109 can be actively controlled and arranged in the housing space 1011 of the base 101. The magnetic side stabilization device 109 can include a magnetic counterpart 110 arranged at the carrier 103 and configured to magnetically interact with the stabilization magnet unit 106. The magnetic counterpart 110 may be a permanent magnet, a ferromagnetic unit or an eddy current unit in some embodiments.

According to embodiments combinable with other embodiments described herein, the stabilization magnet unit 106 can include an actively controlled element, such as for instance an arrangement of coils, or an arrangement of controllable electromagnets. For instance, the coils may be actively controlled so as to reduce or minimize a lateral movement of the carrier 103 away from the transportation track 102 in the lateral direction L.

The stabilization magnet unit 106 as described herein can be arranged in the housing space 1011 of the base 101. The stabilization magnet unit 106 may be an actively controlled unit including a position sensor, a conductor arrangement and a controller configured to actively stabilize the carrier at a predetermined lateral position above the transportation track. By providing the stabilization magnet unit 106 in the housing space, heat generated by the stabilization magnet unit 106 can be more reliably dissipated, and power supply and control can be facilitated.

In some embodiments, the magnetic counterpart 110 may be made of material having permanent magnetic properties. For instance, the magnetic counterpart 110 can include at least one or more permanent magnets. In some embodiments, the magnetic counterpart may be provided as a ferromagnetic element. Alternatively, a closed coil arrangement or electrically conductive element, which receives a changing magnetic field and reacts by producing Lorentz— or magnetic forces, can be used.

Figure 3:
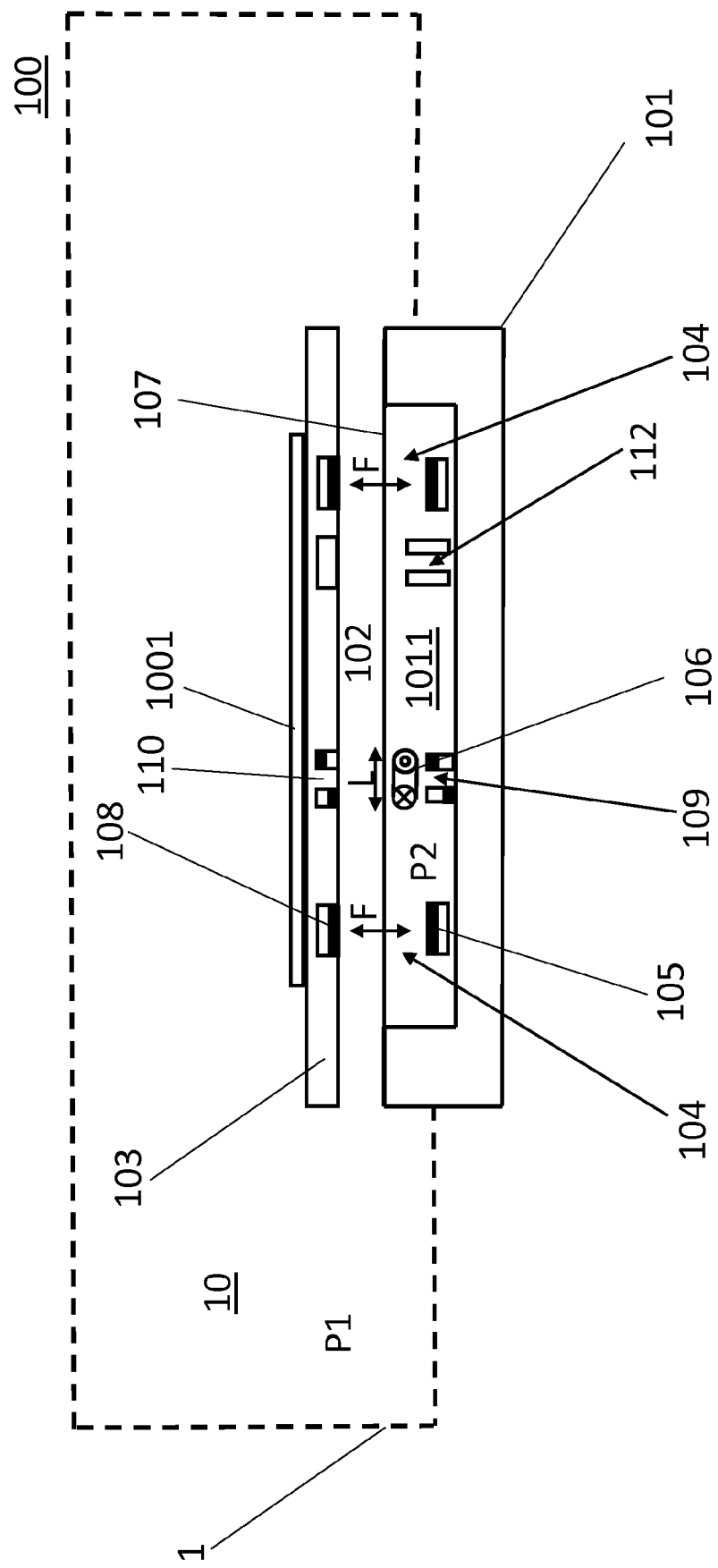
FIG. 3 shows a schematic cross sectional view of a magnetic levitation system according to embodiments described herein, including a Lorentz actuator.

FIG. 3 shows a schematic cross sectional view of a magnetic levitation system according to embodiments of the present disclosure. As exemplarily shown in FIG. 3, the magnetic levitation system 100 can further include a linear motor 112 for moving the carrier 103 along the transportation track 102, the linear motor 112 including drive elements, e.g. drive coils, arranged in the housing space 1011 of the base 101.

By providing the linear motor 112 in the housing space 1011, the magnetic levitation system of the present disclosure can be more reliable in terms of performance. Accordingly, the life cycle of the magnetic levitation system of the present disclosure can be improved. Servicing and maintenance of the active components of the linear motor 112 can be facilitated, and components which are not vacuum-compatible may be used.

According to embodiments combinable with embodiments as described herein, the magnetic side stabilization device 109 can include a Lorentz actuator. A Lorentz actuator may comprise a current conductor such as a coil which may be arranged in the housing space 1011 of the base 101 and which is arranged in a magnetic field generated by the magnetic counterpart 110 of the carrier 103, when the carrier is held above the housing space 1011. By varying the current in the current conductor, a respective Lorentz force is applied to the carrier in the lateral direction L, such that the carrier can be stabilized in the lateral direction by controlling the current in the current conductor. In some embodiments, the stabilization magnet unit 106 that is arranged at the base includes a controllable electromagnet, particularly a coil, arranged such that a Lorentz force acting on the carrier in the lateral direction L can be generated by varying the current flow in the controllable electromagnet. In some embodiments, the magnetic counterpart 110 includes one or two permanent magnets arranged at a bottom of the carrier, such as to generate a magnetic field suitable for interaction with the stabilization magnet unit 106 for the side stabilization of the carrier. A first permanent magnet of the magnetic counterpart 110 may generate a first magnetic field and a second permanent magnet of the magnetic counterpart 110 may generate a second magnetic field that is oppositely directed. When the coil of the stabilization magnet unit 106 is aligned with respect to the first and second magnetic fields of the magnetic counterpart, a reliable side stabilization of the carrier is enabled, as is schematically depicted in FIG. 3. It is noted that, instead of the Lorentz actuator, a different side stabilization device, e.g., based on the principles of magnetic force, direct Lorentz, or Lorentz force based on induced eddy currents can be used in other embodiments.

In some embodiments, the Lorentz actuator may include a controlled coil and a permanent magnetic counterpart or a conductive counterpart exerted by that coil. In some embodiments, the Lorentz actuator may be an electromagnetic actuator with a ferromagnetic counterpart arranged at the carrier.

A magnetic side stabilization device 109 including a Lorentz actuator is beneficial since a Lorentz actuator may generate a stabilization force acting in the lateral direction, even if the stabilization magnet unit 106 is arranged in the housing space 1011 below the carrier, and the magnetic counterpart 110 is arranged at the carrier above the housing space. In other words, no magnetic component arranged at a side of the carrier in the lateral direction L is needed. Accordingly, a flexible and space-saving magnetic levitation system with a flat cover surface of the base can be provided.

As exemplarily shown in FIG. 3, the carrier 103 of the magnetic levitation system 100 can be configured as a passive mover which does not carry any actively controlled magnetic components.

In the present disclosure, the term "mover" can be understood as referring to a carrier configured for carrying a substrate which is contactlessly movable with respect to the base along a transportation track Further, the term "passive mover" can be understood as referring to a carrier being devoid of actively controllable magnet components such as for instance actively controllable electromagnets. In particular, the carrier may be provided with the second magnet unit 108, which may include one, two or more permanent magnets, and with the magnetic counterpart 110 of the magnetic side stabilization device, which may be configured as one or more permanent magnets. Accordingly, no battery or power supply is necessary for holding and moving the carrier above the base.

By providing a passive mover as described herein, several benefits can be achieved, such as for instance an improved life cycle and an improved reliability. Additionally, the magnetic levitation system including a passive mover as described herein, can be more easily designed and manufactured. Further, the magnetic levitation system as described herein can beneficially reduce the manufacturing costs.

FIG. 7 shows a schematic top view of a base defining a transportation track having the shape of a grid according to embodiment of the present disclosure. As exemplarily shown in FIG. 7, the base 101 can have the shape of a grid, in particular the transportation track 102 defined by the base 101 can have a grid layout 700. A grid layout 700 according to the present disclosure can be understood as a transportation track for connecting a plurality of vacuum processing chambers and including at least one of the group consisting of track intersections, curved track sections, two or more tracks extending parallel next to each other, two or more tracks extending perpendicular to each other, two or more tracks enclosing an angle of 10° or more and 80° or less between each other, one or more rotatable track portions configured to change a transport direction of a carrier by rotating the carrier while being levitated. In particular, a discrete grid layout as described herein can be understood as a transportation track configured to connect at least a first vacuum processing chamber 302 to a second vacuum processing chamber 303 as described herein. In particular, the base 101 may connect three, five or more vacuum processing chambers with each other, such that a carrier can be contactlessly transported between the three, five or more vacuum processing chambers along the transport track having a grid layout.

As exemplarily shown in FIG. 7, the grid layout 700 may include a plurality of transportation paths. In particular, the plurality of transportation paths can be understood as one or more transportation paths having different directions. More particularly, the plurality of transportation paths may include at least one of longitudinal transportation paths, perpendicular transportation paths and oblique transportation paths. For instance, a longitudinal transportation path can be understood as a transportation path along the length of the grid layout. Additionally, a perpendicular transportation path can be understood as a transportation path essentially perpendicular to a longitudinal transportation path.

As exemplarily shown in FIG. 7, the grid layout 700 can include one or more intersections 701. The one or more intersections 701 can be configured so as to change the direction of a carrier contactlessly held above the transportation track 102, i.e. above the base 101.

Each of the one or more intersections 701 may include one or more rotatable track portions 113. The one or more rotatable track portions 113 can be configured to change the direction of the carrier 103 contactlessly held above the one or more rotatable track portions 113. The one or more rotatable track portions 113 may include a rotatable disk rotatable around an essentially vertical axis and configured to change the transport direction of the carrier.

The transportation track 102 can be arranged to move the carrier uphill, downhill, along a curved path, and/or along a straight path, or essentially a more or less curved part in 3-dimensional space. The one or more rotatable track portions 113 can be configured to change the direction of the carrier from at least one of a longitudinal transportation path to a perpendicular transportation path and vice versa (see arrow 703), from a perpendicular transportation path to an oblique transportation path and vice versa, and/or from a longitudinal transportation path to an oblique transportation path and vice versa (see arrow 704).

In some embodiments, which may be combined with other embodiments described herein, the base can include a movable track portion configured to change a movement direction of a carrier that is contactlessly held above the movable track portion. The movable track portion can be a rotatable track portion 113 which can be rotated around a vertical rotation axis, such that the direction of a transport track defined by the movable track portion can be changed. FIG. 7 shows a base which includes a plurality of movable track portions configured as rotatable track portions 113.

According to embodiments combinable with embodiments described herein, the movable track portion can include a movable housing space separated from the inner volume 10 of the vacuum chamber 1 and housing at least one magnet unit of the magnetic levitation system 100, e.g. stabilization magnet units, levitation magnets and/or drive magnets. In particular, the movable housing space may be separated by a separation wall 107 from the inner volume 10 of the vacuum chamber 1. The movable housing space may be rotatable, such that the movable housing space can be rotated together with the rotatable track portion.

In some embodiments, the base 101 may include two or more rotatable track portions 113 as described herein.

In some embodiments, at least a portion of the base may be curved, defining a curved track portion, as is schematically indicated by reference numeral 115 in FIG. 7. The carrier can be transported along the curved track portion 115 defined by the base. For example, the direction of the carrier may change by 20° or more, 60° or more, or 90° or more, when the carrier is transported along the curved track portion 115. The curved portion of the base may include a curved housing space which houses a plurality of magnet units of the magnetic levitation system.

In some embodiments, the base may include a track switch portion 114 that allows a track switch of the carrier. The track switch portion 114 may allow a track switch of the carrier between a first track portion and a second track portion defined by the base. For example, a carrier exiting the vacuum processing module 304 of FIG. 7 may be contactlessly transported along a straight base portion, or tracks may be switched and the carrier can be transported along the curved track portion 115.

The track switch portion 114 may be configured as a base portion which branches into two tracks extending in different directions, wherein the direction of the carrier can be switched via the magnetic side stabilization device. A first setting of the magnetic side stabilization device may cause the carrier to move into a first direction, e.g. along the curved track portion 115, and a second setting of the magnetic side stabilization device may cause the carrier to move into a second direction, e.g. along the straight transportation path section in FIG. 7. More specifically, the magnetic side stabilization device is configured to provide an offset of the carrier in the lateral direction, e.g. a little offset to the left or to the right, for changing tracks. In particular, according to embodiments described herein, the magnetic levitation system may include a track switch configured to switch between two or more track portions which is controllable by the magnetic side stabilization device.

The magnetic levitation system described herein may include a base with at least one or more of a rotatable track portion 113, a curved track portion 115, a track switch portion 114, and a track portion running uphill and/or downhill, as is schematically depicted in FIG. 7. A flexible carrier transport can be enabled at reduced costs, since it is not necessary to equip a whole area with magnetic levitation units. Rather, a base defining a predetermined grid layout having magnetic levitation units only along predetermined track portions allows a flexible carrier transport at reduced costs according to embodiments described herein. The magnetic levitation units may be mainly or purely passive in some embodiments.

In the present disclosure, a base may include a plurality of base portions which are connected to each other, e.g. via rotatable track portions 113 as described herein. Each base portion may define a transportation track as described herein. The two or more base portions may be arranged so as to connect a plurality of vacuum processing chambers with each other. Each base portion may include all the features of a base as described herein, including a housing space housing at least one magnet unit of the magnetic levitation system.

According to yet another aspect of the present disclosure, a base of a magnetic levitation system for contactlessly holding and moving a carrier in a vacuum chamber is provided. Particularly, a base for a magnetic levitation system according to any of the embodiments described herein is provided.

Figure 4:
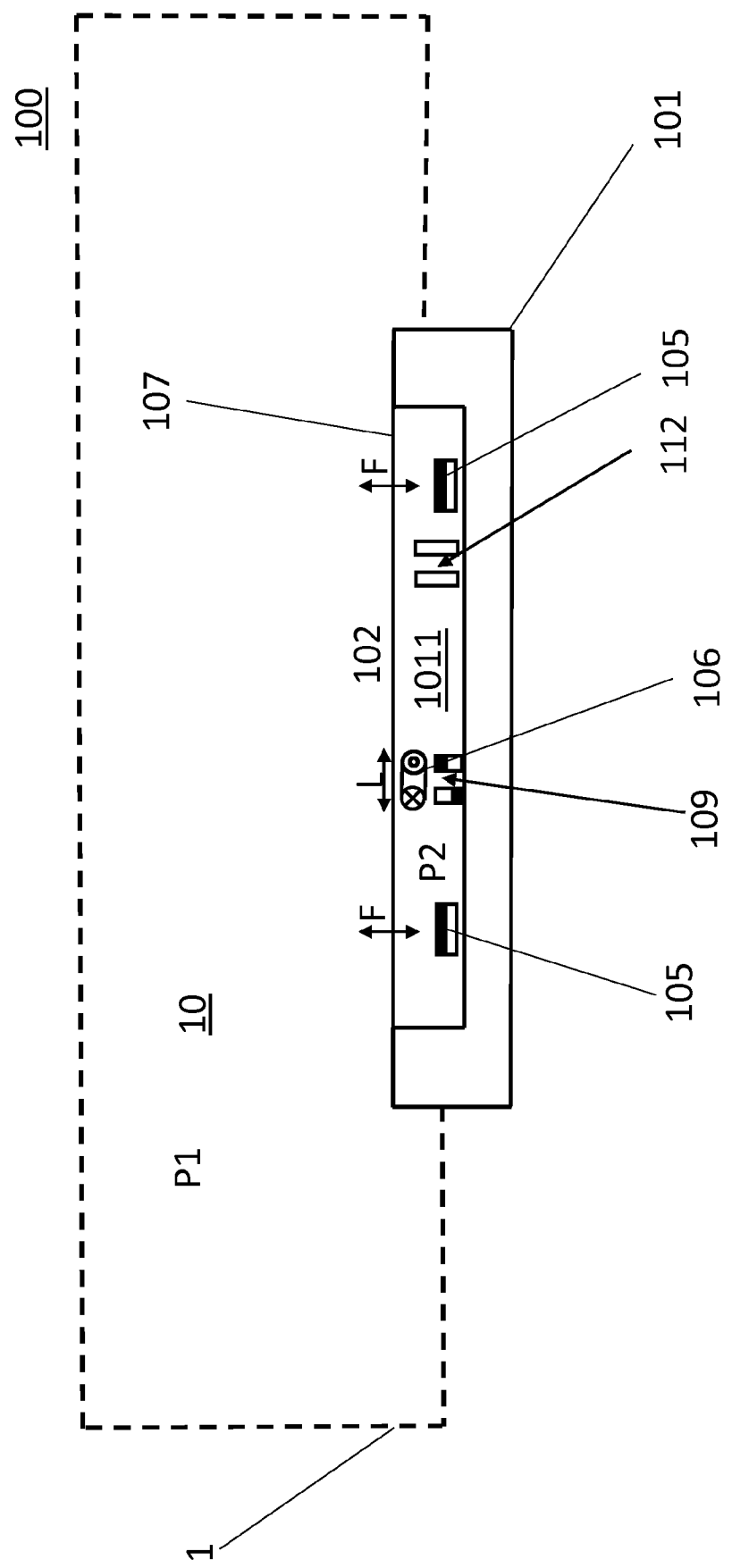
FIG. 4 shows a schematic cross sectional view of a base of a magnetic levitation system according to embodiments described herein.

FIG. 4 shows a cross sectional section of a base of a magnetic levitation system according to embodiments as described herein. As exemplarily shown in FIG. 4, the base 101 of a magnetic levitation system for contactlessly holding and moving a carrier 103 in a vacuum chamber 1, defines a transportation track 102 along which the carrier 103 can be contactlessly moved above the base 101. Further, the base 101 includes a housing space 1011 separated from an inner volume 10 of the vacuum chamber 1 by a separation wall 107 and configured to house at least one of a first magnet unit 105 of at least one magnetic bearing 104 and a stabilization magnet unit 106 of a magnetic side stabilization device 109.

The first magnet unit 105 may include a permanent magnet. In particular, the first magnet unit 105 may include at least two permanent magnets which may be spaced apart from each other in the lateral direction L of the base, such that a plate-like carrier can be held above the base in a horizontal orientation. Further, a plurality of first magnet units 105 may be provided at an essentially regular spacing in the longitudinal direction of the base, i.e. along the transportation track along which the carrier can be contactlessly transported. For example, the base may extend over several meters or tens of meters in the longitudinal direction, such that the carrier can be transported above the base between two distant processing chambers or processing areas of a vacuum system. For example, the base may include tens or hundreds of first magnet units 105 arranged at a regular spacing along the transport track 102.

The stabilization magnet unit 106 may include a controllable coil of a Lorentz actuator arranged in the housing space 1011, such that the carrier can be stabilized in the lateral direction L with respect to the transportation track 102. A plurality of controllable coils may be provided in the housing space 1011 at a regular spacing in the longitudinal direction of the base along the transportation track, such that the carrier can be stabilized in the lateral direction along the extension of the transportation track.

Further, coil units of a linear motor 112 for moving the carrier in the longitudinal direction of the base may be arranged in the housing space 1011 of the base.

The base, the magnetic levitation system, the carrier, the housing space, the separation wall, the first magnet unit, the at least one magnetic bearing and the magnetic side stabilization device have already been described elsewhere in detail, such that reference can be made to the above explanations, which are not repeated here.

According to yet another aspect of the present disclosure, a carrier of a magnetic levitation system according to embodiments described herein is provided. The carrier is configured to be contactlessly held and moved above a base of a magnetic levitation system as described herein. The carrier may include at least one second magnet unit 108 of a magnetic bearing, particularly a permanent magnet. In particular, the carrier of the present disclosure may be configured as a passive mover including exclusively passive magnetic components. In other words and as described above, the carrier of the present disclosure may be a passive mover.

Accordingly, the carrier may not need a battery or a power supply for being contactlessly held above the base. Rather, the carrier may only include permanent magnets and/or ferromagnetic components of magnetic bearings, magnetic side stabilization devices and/or magnetic drive units.

According to yet another aspect of the present disclosure, a vacuum system is provided.

Figure 5:
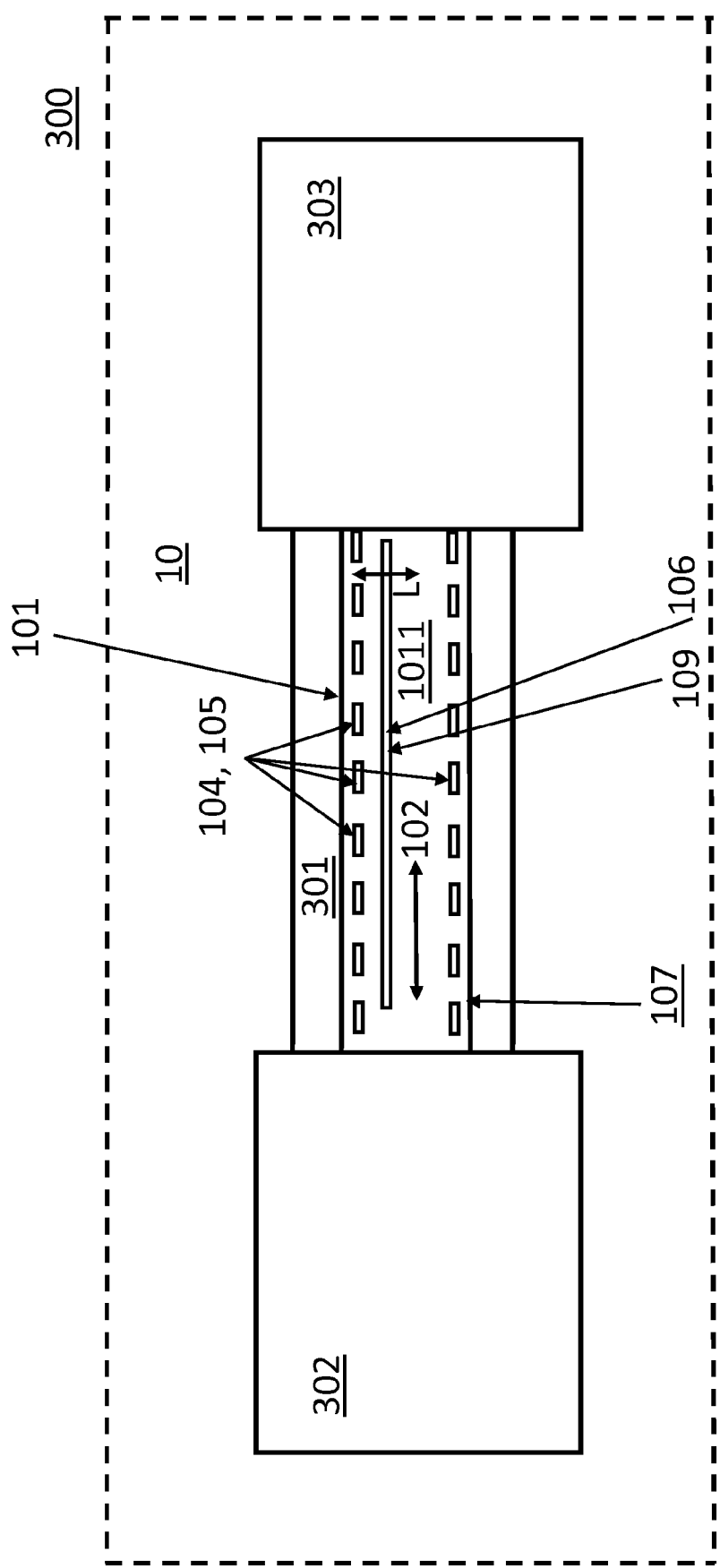
FIG. 5 shows a schematic top view of a vacuum system according to embodiments described herein.

FIG. 5 shows a schematic top view of a vacuum system 300 according to embodiments as described herein. As exemplarily shown in FIG. 5, the vacuum system 300 includes a transport vacuum chamber 301, a first vacuum processing chamber 302 and a second vacuum processing chamber 303. Further, the vacuum system 300 includes a magnetic levitation system for contactlessly holding and moving a carrier (not depicted in FIG. 5) in the transport vacuum chamber 301 from the first vacuum processing chamber 302 to the second vacuum processing chamber 303, along a transportation track 102. The magnetic levitation system 100 includes a base 101 defining the transportation track 102, a carrier movable above the base 101 along the transportation track 102, at least one magnetic bearing 104 for generating a magnetic levitation force F between the base 101 and the carrier. The at least one magnetic bearing 104 further includes a first magnet unit 105 arranged at the base 101 and a second magnet unit arranged at the carrier 103. The magnetic levitation system 100 further includes a magnetic side stabilization device 109 for stabilizing the carrier 103 in a lateral direction. The magnetic side stabilization device 109 includes a stabilization magnet unit 106 arranged at the base 101. At least one of the first magnet unit 105 and the stabilization magnet unit 106 is arranged in a housing space 1011 of the base 101 separated from an inner volume 10 of the transport vacuum chamber 301 by a separation wall 107 (schematically indicated in FIG. 5).

The magnetic levitation system 100 of the vacuum system 300 may include further components described in the present disclosure. Accordingly, reference can be made to the above explanations, which are not repeated here.

In the present disclosure, the first vacuum processing chamber 302 and/or the second vacuum processing chamber 303 can be processing chambers for substrate processing, e.g. wafer handling, wafer preparation, wafer coating, wafer etching, wafer storage. For example, at least one of the first vacuum processing chamber 302 and the second vacuum processing chamber 303 can be a material deposition chamber, particularly for manufacturing displays such as for instance OLED displays.

According to embodiments combinable with other embodiments described herein, the transportation vacuum chamber 301 can correspond to the vacuum chamber 1 as described herein and may include some or all of the features described herein.

In the present disclosure, a vacuum processing chamber can be understood as a vacuum processing system for the processing of one or more substrates under subatmospheric pressure. The vacuum processing chamber may be operated by way of hardware components, a computer programmed by appropriate software, by any combination of the two or in any other manner.

According to yet another aspect of the present disclosure, a method of contactlessly holding and moving a carrier in a vacuum chamber is provided.

Figure 6:
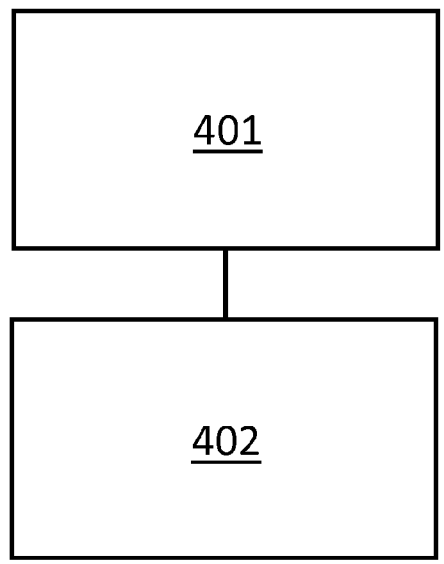
FIG. 6 shows a flow chart of a method for holding and moving a carrier in a vacuum chamber according to embodiments described herein.

FIG. 6 shows a flowchart of a method according to embodiments as described herein. As exemplarily shown in FIG. 6, the method 400 includes providing 401 a base defining a transportation track and a carrier movable above the base along the transportation track, and generating 402 a magnetic levitation force F between the base and the carrier with at least one magnetic bearing including a first magnet unit arranged at the base and a second magnet unit arranged at the carrier. At the same time, the carrier is stabilized in the lateral direction with a magnetic side stabilization device including a stabilization magnet unit arranged at the base. The carrier is arranged in an inner volume of the vacuum chamber provided at a first pressure, and at least one of the first magnet unit and the stabilization magnet unit is arranged in a housing space of the base provided at a second pressure higher than the first pressure.

For further details of the method, reference is made to the above explanations, which are not repeated here.

According to embodiments combinable with embodiments as described herein, the magnetic levitation force F may be generated purely in a passive way. In particular, the term "passive way" can be understood as a magnetic levitation force F that can be generated exclusively by components having permanent magnetic properties. In other words, the magnetic levitation force F can be understood as a force being imparted by permanent magnets, particularly permanent magnets having poles of the same polarity facing each other. Additionally or alternatively, the magnetic levitation force F can be generated as a repulsive force between the base and the carrier of a magnetic levitation system as described above. Furthermore, the magnetic levitation force F can be generated as a force being imparted between a passive mover as described herein and a base according to embodiments described herein.

The magnetic side stabilization device for stabilization of the carrier in the lateral direction may include an active control. For example, the magnetic side stabilization device may include a position sensor for sensing the lateral position of the carrier and a Lorentz actuator for correcting the lateral position depending on the sensed position value.

A position sensor may be provided for measuring a carrier position and/or a carrier orientation, and a signal of the position sensor may be used for controlling the lateral position of the carrier via the side stabilization device. In some embodiments, the position sensor includes a camera device configured for observing a position and/or an orientation of one or more carriers, e.g. from the top, and for feeding a sensor signal to a controller of at least one of the side stabilization device and the drive unit. Alternatively or additionally, the position sensor may include at least one of a magnetic position sensor, an eddy current sensor, a capacitive senor or an optical sensor. For example, the separation wall may be made of a transparent material, such as glass, and at least a part of an optical sensor, such as a light source and/or a light detector, may be arranged below the transparent separation wall. In some embodiments, a combination of different sensors and/or a camera may be adapted not only to determine the lateral position of the carrier, but also an angle deviation and/or a position along the track in the transport direction, which can be used advantageously on the overall control for the carrier transport.

According to embodiments combinable with embodiments described herein, the first pressure P1 provided in the inner volume of the vacuum chamber can be a subatmospheric pressure, e.g. a pressure of 10 mbar or less. The second pressure P2 provided in the housing space of the base can be a pressure different from the first pressure P1, particularly an atmospheric pressure. Service and maintenance of the actively controlled components arranged in the housing space can be facilitated.

In the present disclosure, stabilizing can be carried out by a magnetic side stabilization device being actively controlled, particularly wherein the magnetic side stabilization device can include a Lorentz actuator.

According to embodiments combinable with embodiments described herein, the vacuum system can be provided with a magnetic levitation system as described herein. In particular, the vacuum system can include at least one of a base and a carrier, i.e. passive mover, as described herein.

While the foregoing is directed to embodiments of the disclosure, other and further embodiments of the disclosure may be devised without departing from the basic scope thereof, and the scope thereof is determined by the claims that follow.

In particular, this written description uses examples to disclose the disclosure, including the best mode, and to enable any person skilled in the art to practice the described subject-matter, including making and using any devices or systems and performing any incorporated methods. While various specific embodiments have been disclosed in the foregoing, mutually non-exclusive features of the embodiments described above may be combined with each other. The patentable scope is defined by the claims, and other examples are intended to be within the scope of the claims if the claims have structural elements that do not differ from the literal language of the claims, or if the claims include equivalent structural elements with insubstantial differences from the literal language of the claims.

The invention claimed is:

1. A magnetic levitation system for contactlessly holding and moving a carrier in a vacuum chamber, comprising:
   a base defining a transportation track;
   a carrier movable above and relative to the base along the transportation track;
   at least one magnetic bearing for generating a magnetic levitation force (F) between the base and the carrier, the at least one magnetic bearing comprising a first magnet unit arranged at the base and a second magnet unit arranged at the carrier; and
   a magnetic side stabilization device for stabilizing the carrier in a lateral direction, the magnetic side stabilization device comprising a stabilization magnet unit arranged at the base;
   wherein at least one of the first magnet unit and the stabilization magnet unit is arranged in a housing space of the base, the housing space being separated from an inner volume of the vacuum chamber by a separation wall.

2. The magnetic levitation system of claim 1, wherein the first magnet unit and the second magnet unit are permanent magnets with poles of the same polarity facing each other.

3. The magnetic levitation system of claim 1, wherein the separation wall provides a vacuum-tight sealing between the inner volume of the vacuum chamber and the housing space of the base.

4. The magnetic levitation system of claim 1, wherein the separation wall is provided as a flat cover covering the base and extending along the transportation track.

5. The magnetic levitation system of claim 1, wherein the separation wall is provided as a non-magnetic metal sheet.

6. The magnetic levitation system of claim 1, wherein the separation wall has a thickness of 0.5 mm or more and 5 mm or less.

7. The magnetic levitation system of claim 1, wherein the stabilization magnet unit of the magnetic side stabilization device is actively controlled and arranged in the housing space of the base, the magnetic side stabilization device further comprising a magnetic counterpart arranged at the carrier and configured to magnetically interact with the stabilization magnet unit.

8. The magnetic levitation system of claim 1, wherein the magnetic side stabilization device comprises a Lorentz actuator.

9. The magnetic levitation system of claim 1, further comprising a linear motor for moving the carrier along the transportation track, the linear motor comprising drive coils arranged in the housing space.

10. The magnetic levitation system of claim 1, wherein the carrier is configured as a passive mover which does not carry an actively controlled magnetic component.

11. The magnetic levitation system of claim 1, wherein the base comprises a movable track portion configured to change a movement direction of a carrier that is contactlessly held above the movable track portion.

12. The magnetic levitation system of claim 11, wherein the movable track portion is a rotatable track portion configured to change the movement direction of the carrier that is contactlessly held above the rotatable track portion.

13. The magnetic levitation system of claim 11, wherein the movable track portion includes a movable housing space separated from the inner volume of the vacuum chamber and housing at least one magnet unit of the magnetic levitation system.

14. A base of a magnetic levitation system for contactlessly holding and moving a carrier in a vacuum chamber, wherein the base defines a transportation track along which a carrier can be contactlessly moved above and relative to the base, wherein the base comprises a housing space separated from an inner volume of the vacuum chamber by a separation wall and wherein the housing space houses at least one of a first magnet unit of at least one magnetic bearing and a stabilization magnet unit of a magnetic side stabilization device.

15. The magnetic levitation system of claim 7, wherein the magnetic counterpart comprises a permanent magnet and the stabilization magnet unit comprises a coil.

16. A vacuum system, comprising:
a transport vacuum chamber;
a first vacuum processing chamber and a second vacuum processing chamber; and
a magnetic levitation system for contactlessly holding and moving a carrier in the transport vacuum chamber from the first vacuum processing chamber to the second vacuum processing chamber along a transportation track, the magnetic levitation system comprising:
a base defining the transportation track;
the carrier movable above and relative to the base along the transportation track;
at least one magnetic bearing for generating a magnetic levitation force (F) between the base and the carrier, the at least one magnetic bearing comprising a first magnet unit arranged at the base; and
a magnetic side stabilization device for stabilizing the carrier in a lateral direction, the magnetic side stabilization device comprising a stabilization magnet unit arranged at the base, wherein at least one of the first magnet unit and the stabilization magnet unit is arranged in a housing space of the base which is separated from an inner volume of the transport vacuum chamber by a separation wall.

17. A method of contactlessly holding and moving a carrier in a vacuum chamber, comprising:
providing a base defining a transportation track and a carrier movable above and relative to the base along the transportation track;
generating a magnetic levitation force (F) between the base and the carrier with at least one magnetic bearing comprising a first magnet unit arranged at the base and a second magnet unit arranged at the carrier; and
stabilizing the carrier in a lateral direction with a magnetic side stabilization device comprising a stabilization magnet unit arranged at the base, the carrier being arranged in an inner volume of the vacuum chamber provided at a first pressure (P1) and at least one of the first magnet unit and the stabilization magnet unit being arranged in a housing space of the base provided at a second pressure (P2) different from the first pressure (P1).

18. The method of claim 17, wherein the magnetic levitation force (F) is generated in a purely passive way.

19. The method of claim 17, wherein the magnetic side stabilization device is actively controlled.

20. The method of claim 17, wherein the magnetic side stabilization device comprises a Lorentz actuator.

* * * * *